(12) United States Patent
Casper et al.

(10) Patent No.: US 6,878,920 B2
(45) Date of Patent: Apr. 12, 2005

(54) OPTICAL RECEIVER CIRCUIT, METHOD, AND SYSTEM

(75) Inventors: Bryan K. Casper, Hillsboro, OR (US); James E. Jaussi, Hillsboro, OR (US); Tanay Karnik, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 268 days.

(21) Appl. No.: 10/186,311

(22) Filed: Jun. 28, 2002

(65) Prior Publication Data

US 2004/0000633 A1 Jan. 1, 2004

(51) Int. Cl.[7] .............................................. H01J 40/14
(52) U.S. Cl. ............................ 250/214 R; 250/214 C; 327/514
(58) Field of Search ......................... 250/214 R, 214 C, 250/214 DC, 551; 327/514

(56) References Cited

U.S. PATENT DOCUMENTS 5,481,118 A * 1/1996 Tew ............................ 250/551

* cited by examiner

*Primary Examiner*—Stephone B. Allen
*Assistant Examiner*—Patrick J. Lee
(74) *Attorney, Agent, or Firm*—Schwegman, Lundberg, Woessner & Kluth, P.A.

(57) ABSTRACT

An optical receiver includes a photodiode, a variable current source, and a current mode comparator to detect a difference between current from the photodiode and current from the variable current source.

30 Claims, 8 Drawing Sheets

OPTICAL RECEIVER CIRCUIT, METHOD, AND SYSTEM

BACKGROUND

Integrated circuit speeds (as measured by data rates inside integrated circuits) are continually increasing as technology advances. For example, integrated circuits such as microprocessors and peripheral devices in computers are becoming faster and faster. As integrated circuits become faster, the challenge of electrically interconnecting integrated circuits becomes greater. In general, it is difficult to design interconnects between integrated circuits with data rates sufficient to keep pace with the internal data rates of integrated circuits.

DESCRIPTION OF EMBODIMENTS

Figure 1:
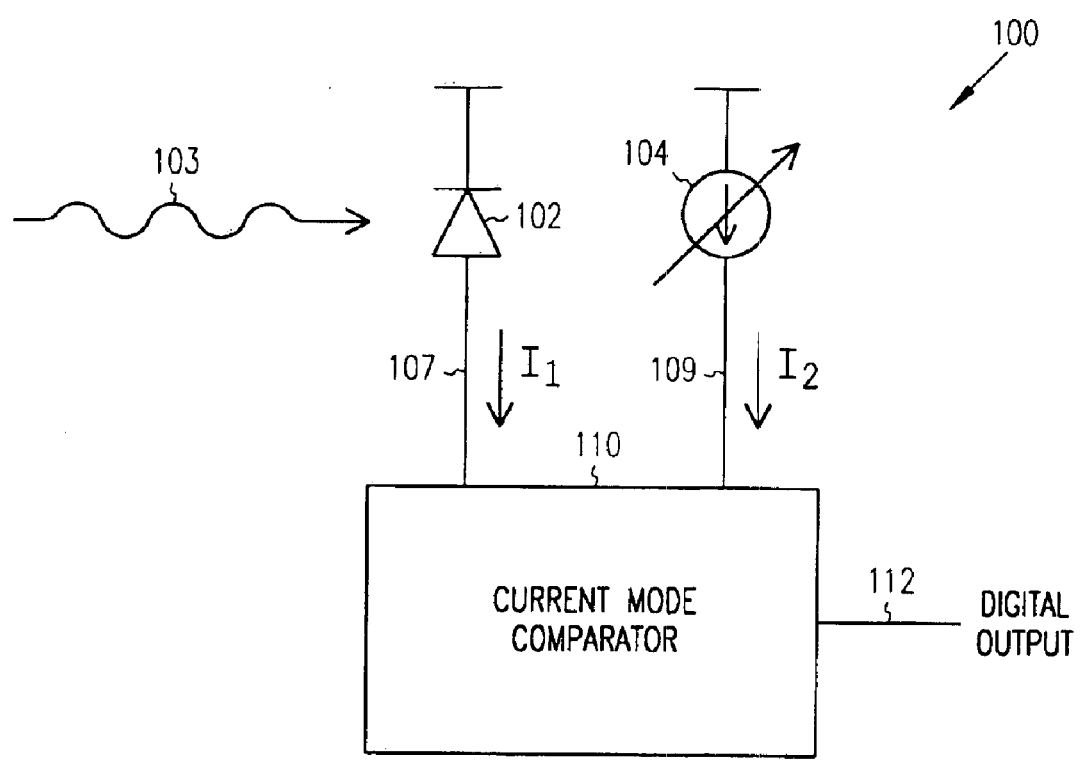
FIG. 1 shows a diagram illustrating an optical receiver.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein in connection with one embodiment may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

FIG. 1 shows a diagram illustrating an optical receiver. Optical receiver 100 includes photodiode 102, variable current source 104, and current mode comparator 110. Photodiode 102 receives incident light 103 and produces current $I_1$ on node 107. Variable current source 104 produces current $I_2$ on node 109. Current mode comparator 110 compares currents $I_1$ and $I_2$, and produces a digital output signal on node 112. In some embodiments of the present invention, the digital output signal on node 112 is a voltage signal. In other embodiments of the present invention, the digital output signal on node 112 is a current signal.

In operation, current produced by photodiode 102 ($I_1$) varies as the intensity of incident light 103 varies. For example, when incident light 103 is bright, photodiode 102 produces more current than when incident light 103 is not bright. The amount of current sourced by photodiode 102 may also vary as a function of process variations, temperature variations, and other factors.

Variable current source 104 sources current $I_2$ in response to a control word received (not shown). Current $I_2$ can be set to any current value based on any criteria. For example, current $I_2$ may be set to a current value that is near the center of the expected value of current $I_1$ to allow the digital output signal on node 112 to change state as current $I_1$ varies. Also for example, current $I_2$ may be set to a current value that is outside (either above or below) the expected value of current $I_1$ to allow the digital output signal on node 112 to remain at a static level.

In some embodiments of the present invention, incident light 103 varies to represent a digital signal. For example, when incident light 103 is bright, a digital "1" is represented, and when incident light is not bright, a digital "0" is represented. Photodiode 104 translates the digital signal as represented by incident light 103 into a varying current $I_1$. As explained above, current $I_2$ can be set to a value within the normal operating range of $I_1$ so that when current mode comparator 110 compares $I_1$ and $I_2$, the digital output signal on node 112 reflects the digital signal represented by incident light 103.

Figure 2:
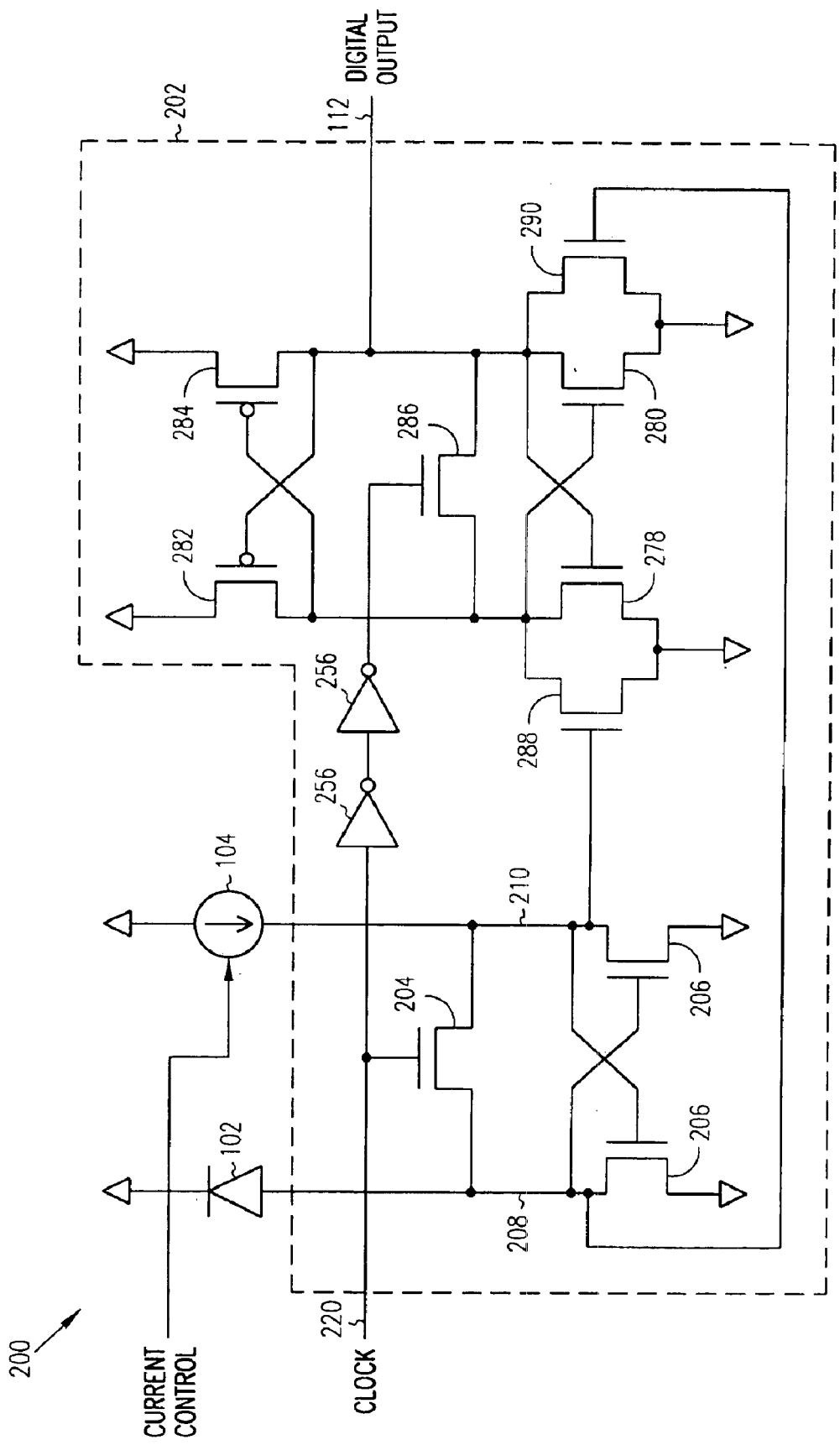
FIG. 2 shows a circuit schematic illustrating an optical receiver.

FIG. 2 shows a circuit schematic illustrating an optical receiver. Optical receiver 200 includes photodiode 102, variable current source 104, and current mode comparator 202. Current mode comparator 202 includes an evaluation stage made up of switched transistor 204 and cross-coupled load transistors 206. The evaluation stage provides a load that produces a differential voltage in response to the current difference on nodes 208 and 210 when the CLOCK signal on node 220 turns off switched transistor 204. Switched transistor 204 is an example of a switching circuit that electrically couples nodes 208 and 210 as a function of a clock signal. Any suitable device or devices can be substituted for switching transistor 204 without departing from the scope of the present invention.

The evaluation stage further includes a pair of cross-coupled n-channel transistors 278 and 280, a pair of cross-coupled p-channel transistors 282 and 284, n-channel switched transistor 286, and a pair of n-channel transistors 288 and 290. Transistors 288 and 290 are coupled to nodes 208 and 210. Transistor 288 is connected in parallel with transistor 278, and transistor 290 is connected in parallel with transistor 280.

The figures show n-channel isolated gate field effect transistors and p-channel isolated gate field effect transistors. In some embodiments, the n-channel isolated gate field effect transistors are n-channel metal oxide semiconductor field effect transistors (NMOSFETs), and the p-channel isolated gate field effect transistors are p-channel metal oxide semiconductor field effect transistors (PMOSFETs). The choice of NMOSFETs and PMOSFETs for use in the figures is strictly one of convenience. The method and apparatus of the present invention can be practiced with other types of components such as bipolar junction transistors. Further, n-channel transistors can be used in place of the p-channel transistors, and p-channel transistors can be used in place of the n-channel transistors. A great number of suitable component types exist to practice the various embodiments of the invention, and a choice of any of these component types can be made without departing from the scope of the present invention.

In operation, when the CLOCK signal is at a steady-state high level, switched transistors 204 and 286 are both closed. With switched transistor 204 closed, nodes 208 and 210 are forced to be at substantially the same potential. When the CLOCK signal transitions from a high level to a low level, switched transistor 204 opens and voltages on nodes 208 and 210 are allowed to vary as a function of any current differential that exists on nodes 208 and 210. Inverters 256 delay the clock signal on node 220 and apply it to switched transistor 286. When switched transistor 286 opens, the voltage difference on nodes 208 and 210 is evaluated, and a digital output signal is provided on node 112.

Figure 3:
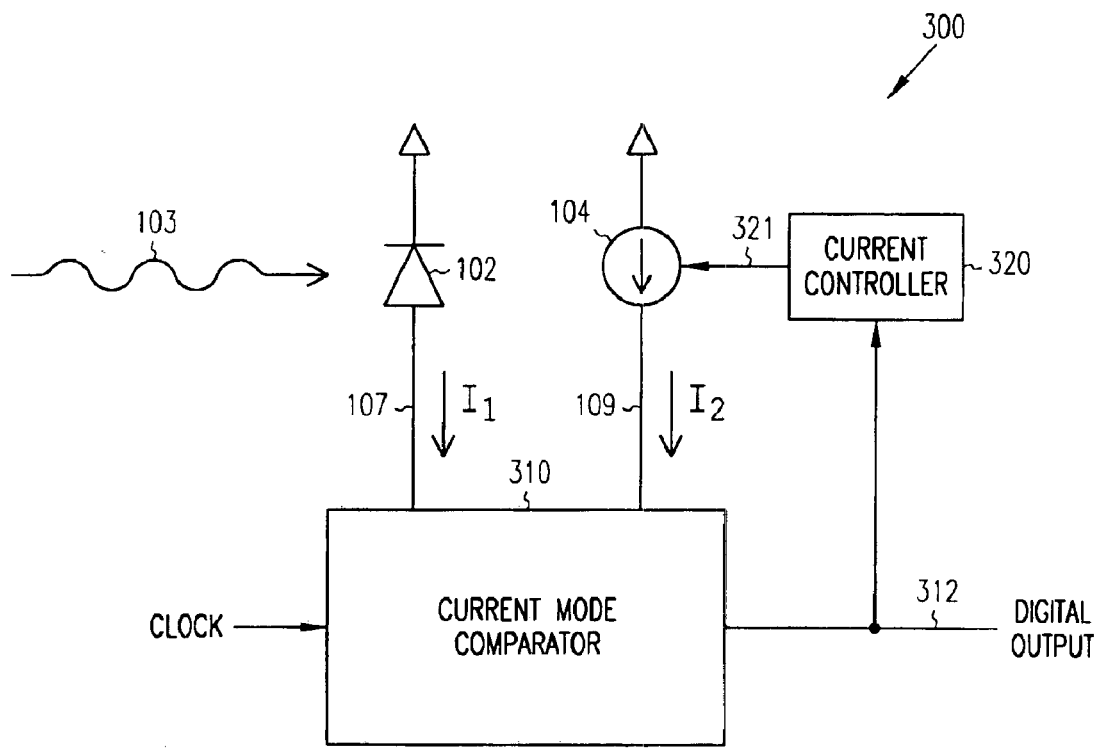
FIG. 3 shows a diagram illustrating an optical receiver with a current controller.

FIG. 3 shows a diagram illustrating an optical receiver with a current controller. Optical receiver 300 includes photodiode 102, variable current source 104, current mode comparator 310, and current controller 320. Current mode comparator 310 can be any suitable current mode comparator, including those shown in FIGS. 1 and 2. Current controller 320 receives the digital output signal on node 312, and sets the value of $I_2$ by varying control signals on node 321.

In some embodiments of the present invention, current controller 320 sets the value of $I_2$ based in part on the information received on node 312. For example, when incident light 103 is varying in a digital manner as described above, and $I_2$ is set to a nominal value, the digital output signal on node 312 varies to reflect the changing state of incident light 103. Current controller 320 can increase $I_2$ until a threshold current level is reached that causes the digital output signal to remain static. This occurs when $I_2$ is increased to the point where $I_1$ no longer transitions to a higher value than $I_2$. Current controller 320 can also decrease $I_2$ until a second threshold current level is reached that causes the digital output signal on node 312 to remain static in the opposite logical state. This operation is shown in FIG. 4.

Figure 4:
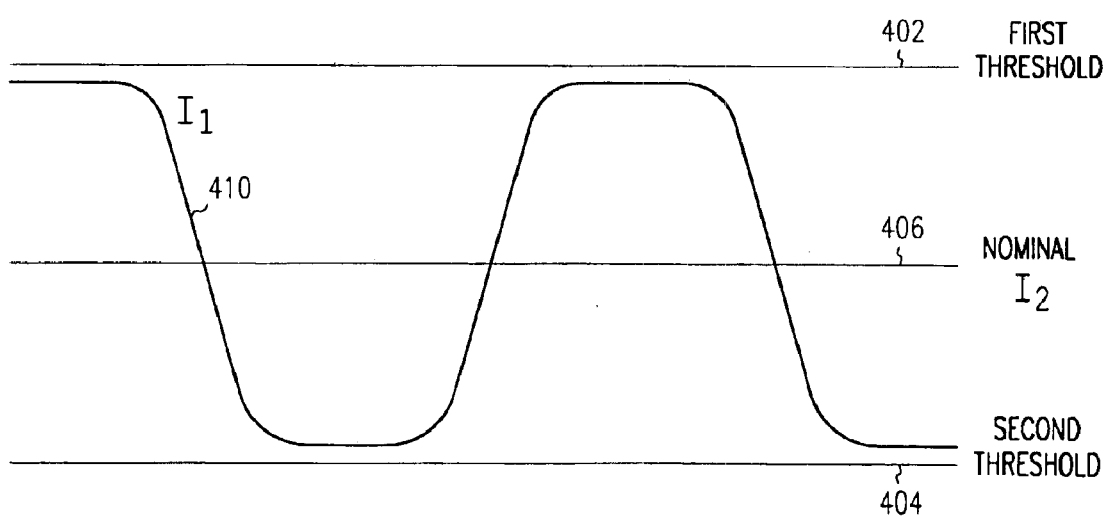
FIG. 4 shows a waveform plot illustrating currents in a current mode comparator.

FIG. 4 shows a waveform plot illustrating currents in a current mode comparator. Waveform 410 represents current $I_1$ produced by photodiode 102 as incident light 103 varies. Waveform 406 represents a nominal value for current $I_2$. When current $I_2$ is at this nominal value, the digital output signal on node 312 changes state each time waveform 410 crosses waveform 406. Waveforms 402 and 404 represent threshold current levels that, when set, cause the digital output signal on node 312 to remain static.

In operation, the nominal value for $I_2$ may change based on temperature, process, the average light intensity of incident light 103, and other factors. The various embodiments of the present invention can set the value of $I_2$ to approximate the nominal value by determining the two threshold values, and then setting $I_2$ to a value in between. For example, in operation, current controller 320 can increase $I_2$ until the digital output signal on node 312 becomes static. The value of $I_2$ that gives rise to this condition is the first threshold current level. Then, current controller 320 can decrease $I_2$ until the digital output signal on node 312 becomes static in the opposite logical state. The value of $I_2$ that gives rise to this condition is the second threshold current level. The nominal value for $I_2$ can then be determined from the first and second threshold current levels.

In some embodiments, the nominal value for $I_2$ is the average of the first and second threshold current levels. In other embodiments, the nominal value for $I_2$ is not the average of the two threshold levels, but is instead determined to optimize a performance characteristic. For example, $I_2$ may be set to increase a noise margin, or to compensate for noise characteristics of photodiode 102. Any criteria may be used to determine the nominal setting for $I_2$.

Current controller 320 can set the nominal value for $I_2$ at any time. For example, in some embodiments of the present invention, the nominal value is set during an initialization period when power is applied or current controller 320 is reset. In other embodiments, the nominal value is set periodically. In embodiments that periodically set the nominal value, current controller 320 may detect a training data sequence, and then perform the actions described above with reference to FIG. 4. In other embodiments, a time slice may be set aside for the purpose of calibration. In these various embodiments of the present invention, the calibration may be performed when receiving either a training data sequence, or when receiving data during the normal course of data communications.

Current controller 320 can be any type of controller capable of setting a control word on node 321. Examples include, but are not limited to, a microprocessor, a microcontroller, or a state machine. In some embodiments, current controller 320 includes a state machine that receives an indication of a calibration time, and performs the above described actions in response thereto.

Figure 5:
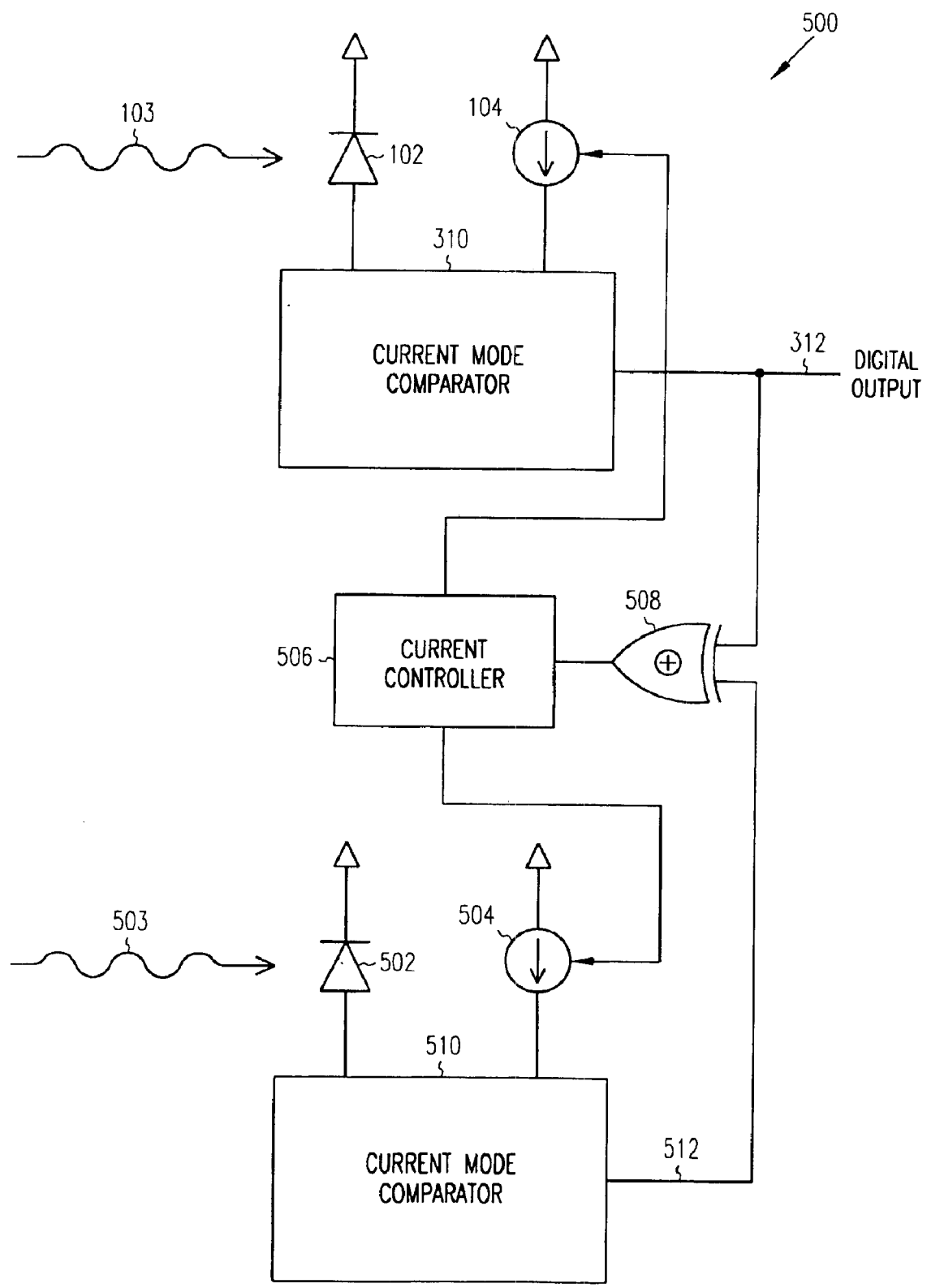
FIG. 5 shows a diagram illustrating multiple optical receivers with a current controller.

FIG. 5 shows a diagram illustrating multiple optical receivers with a current controller. Circuit 500 includes current mode comparators 310 and 510, photodiodes 102 and 502, variable current sources 104 and 504, current controller 506 and digital comparator 508. Current mode comparator 310, photodiode 102, and variable current source 104 form an optical receiver such as those shown in the previous figures. Current mode comparator 510, photodiode 502, and variable current source 504 also form an optical receiver such as those shown in the previous figures.

In embodiments represented by FIG. 5, current mode comparators 310 and 510 produce digital output signals on nodes 312 and 512, respectively. The digital output signals are influenced by incident light 103 and 503, and are also influenced by the currents sourced by variable current sources 104 and 504. Current controller 506 controls the currents sourced by variable current sources 104 and 504 in response to digital comparator 508. Digital comparator 508 is shown in FIG. 5 as an exclusive-or gate, but any circuit element capable of comparing digital signals can be substituted as an equivalent device.

In some embodiments of the present invention, photodiodes 102 and 502 are placed in close proximity to each other so that incident light 103 and 503 received by the photodiodes are substantially the same, and so that the photodiodes share substantially the same process and temperature characteristics. When the photodiodes share the same process and temperature characteristics and also receive substantially the same incident light, the behavior of photodiodes 102 and 502 are substantially matched.

Current controller 506 is able to separately adjust the current output of variable current sources 104 and 504. By varying the currents separately, circuit 500 can continuously set the nominal value of the current output of variable current source 104 without waiting for a calibration interval. For example, in some embodiments of the present invention, current controller 506 can increase and decrease the current output of variable current source 504 to determine the first and second threshold current levels as discussed above with reference to FIG. 4. When either threshold value is reached, the output of digital comparator 508 toggles for each data transition on node 312.

Current controller 506 can utilize the information describing the threshold current levels for variable current source 504 to set the nominal value for the current output of variable current source 104. This process can take place without interrupting the data communications performed by current mode comparator 310.

Figure 6:
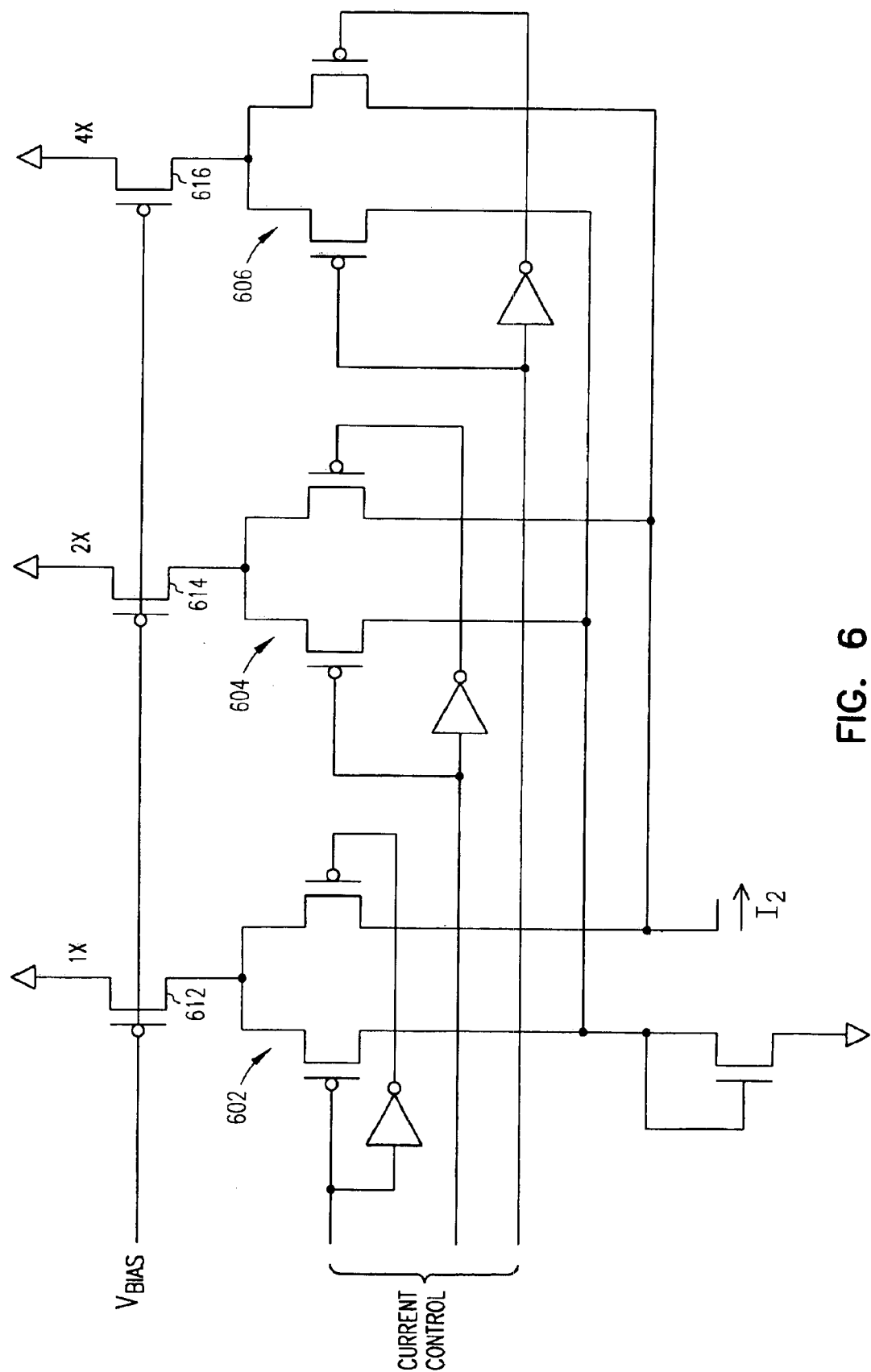
FIG. 6 shows a circuit schematic illustrating a variable current source.

FIG. 6 shows a circuit schematic illustrating a variable current source. Variable current source 600 is a current source suitable for use as current sources 104 and 504 (FIG. 5). Current source 600 includes differential pairs of transistors 602, 604, and 606. Each differential pair of transistors is coupled to one of tail transistors 612, 614, and 616. Tail transistors 612, 614, and 616 each provide a current based on the area of the tail transistor and the bias voltage applied thereto. In embodiments represented by FIG. 6, the bias voltage applied to each tail transistor is the same, but the sizes of the various tail transistors are related in a binary fashion. As current control word 620 counts up, current $I_2$ sourced by current source 600 increases in a binary fashion.

Other embodiments include equally sized tail transistors so that the current $I_2$ increases linearly as each successive control word node is asserted. In still other embodiments, the bias voltages applied to the tail transistors varies. Other variable current source circuits can be utilized as equivalent circuits.

Figure 7:
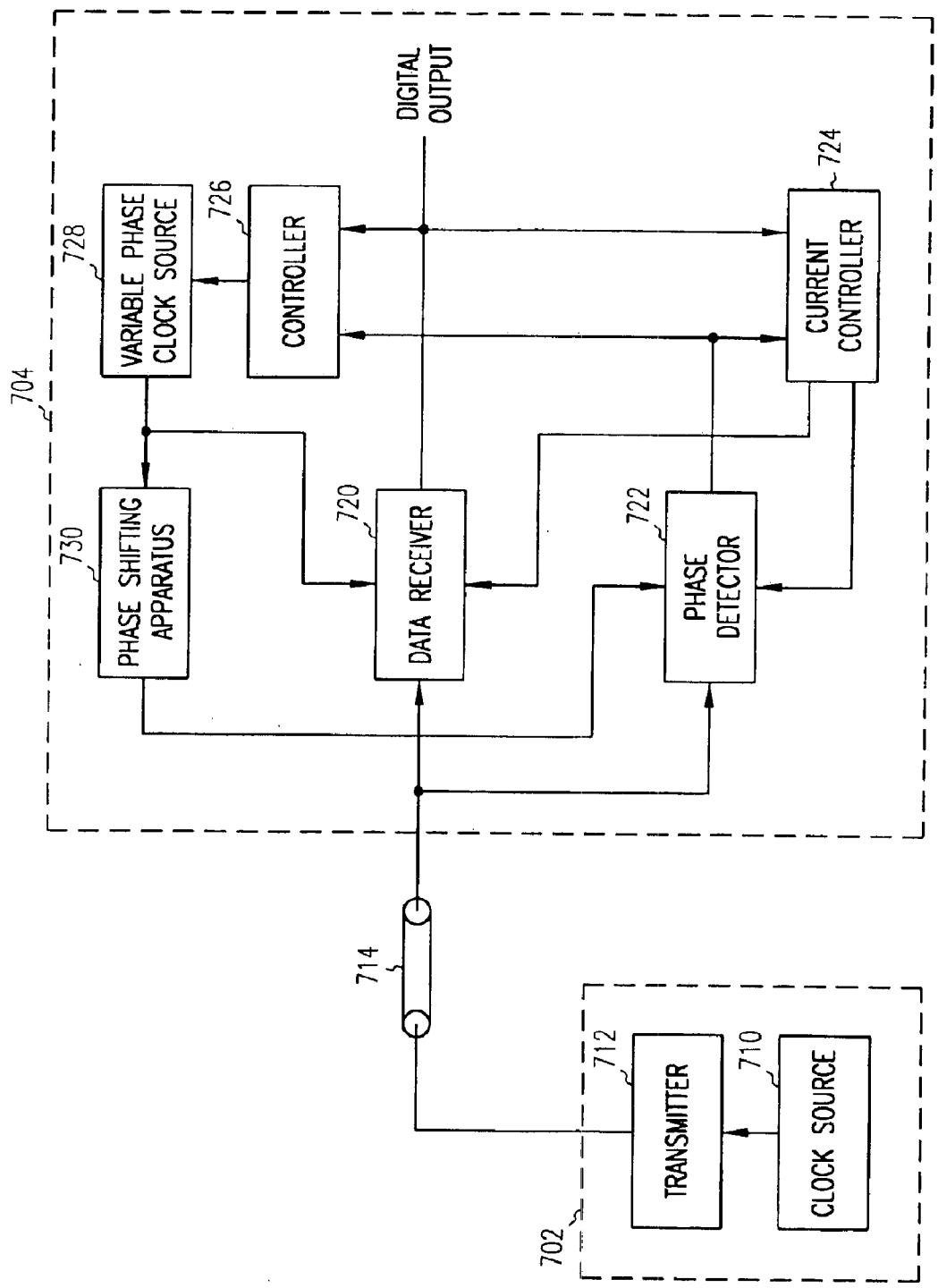
FIG. 7 shows an optical receiver with clock recovery.

FIG. 7 shows an optical receiver with clock recovery. FIG. 7 shows integrated circuits 702 and 704. Integrated circuit 702 includes clock source 710 and transmitter 712. Transmitter 712 transmits data through transmission medium 714 to integrated circuit 704. Because the clock produced by clock source 710 is not transmitted along with the data by integrated circuit 702, integrated circuit 704 "recovers" the clock from the received data.

Integrated circuit 704 includes data receiver 720 and phase detector 722, controllers 724 and 726, variable phase clock source 728, and phase shifting apparatus 730. Data receiver 720 and phase detector 722 each include optical receivers such as those shown in the previous figures. For example, data receiver 720 may include current mode comparator 310, photodiode 102, and variable current source 104; and phase detector 722 may include current mode comparator 510, photodiode 502, and variable current source 504 (FIG. 5).

Data receiver 720 and phase detector 722 both receive an input signal from transmission medium 714. In some embodiments, transmission medium 714 is an optical transmission medium such as an optical waveguide or a fiber optic cable. Photodiodes within data receiver 720 and phase detector 722 are placed in close physical proximity to each other on integrated circuit 704 so that they receive substantially the same incident light.

Current controller 724 corresponds to the combination of current controller 506 and digital comparator 508 (FIG. 5). Current controller 724 receives digital output signals from both data receiver 720 and phase detector 722, and sets the current output from variable current sources within data receiver 720 and phase detector 722.

Controller 726 also receives digital output signals from data receiver 720 and phase detector 722. Variable phase clock source 728 receives control signals from controller 726, and provides a clock signal to data receiver 720 and phase shifting apparatus 730. Phase shifting apparatus 730 provides a clock signal to phase detector 722. Phase shifting apparatus 730 can shift the phase of the clock signal by any phase angle prior to providing the clock signal to phase detector 722. For example, in some embodiments, phase shifting apparatus 730 shifts the phase of the clock signal by 180 degrees, and in other embodiments, phase shifting apparatus 730 shifts the phase of the clock signal by 90 degrees. In some embodiments, phase shifting apparatus 730 shifts the clock phase in response to a control signal (not shown) provided by a control circuit such as a microprocessor or controller 726. One example of a possible phase relationship between the input data and the various clock signals is shown in FIG. 8.

Figure 8:
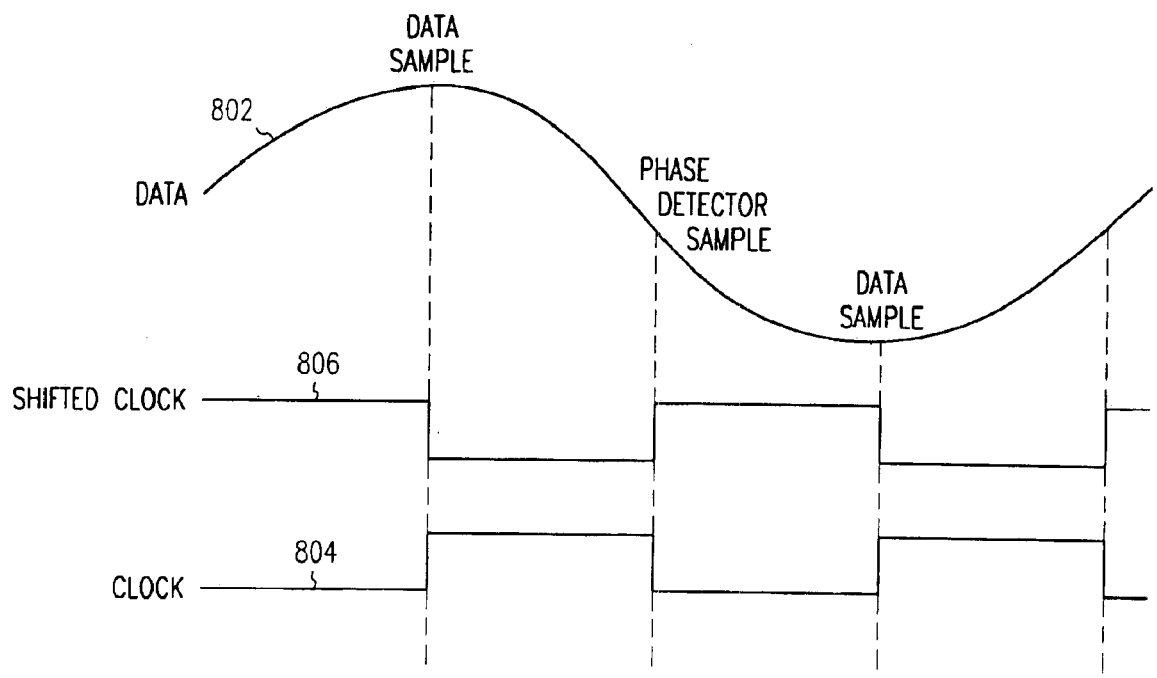
FIG. 8 shows a waveform plot in accordance with some embodiments represented by FIG. 7.

FIG. 8 shows a waveform plot in accordance with some embodiments represented by FIG. 7. Waveform 802 represents the data received by data receiver 720 and phase detector 722. Waveform 804 represents the clock signal provided to data receiver 720 by variable phase clock source 728, and waveform 806 represents the clock signal provided to phase detector 722 by phase shifting apparatus 730.

In embodiments represented by FIG. 8, the clock signal is at substantially twice the frequency of the data signal, and phase shifting apparatus 730 shifts the phase of the clock signal by substantially 180 degrees. In other embodiments, the clock signal and the data signal are at substantially the same frequency, and phase shifting apparatus 730 shifts the phase of the clock signal by substantially 90 degrees. In still further embodiments, the phase of the clock signal is shifted by a phase angle different from 180 degrees or 90 degrees.

In operation, data receiver 720 samples the data signal at the rising edge of waveform 804, and phase detector 722 samples the data signal at the rising edge of waveform 806. Controller 726 compares the data sampled by both data receiver 720 and phase detector 722, and influences variable phase clock source 728. By varying the clock signal in response to the data sampled by data receiver 720 and phase detector 722, controller 726 can recover the clock provided to transmitter 712 by clock source 710 in integrated circuit 704.

Figure 9:
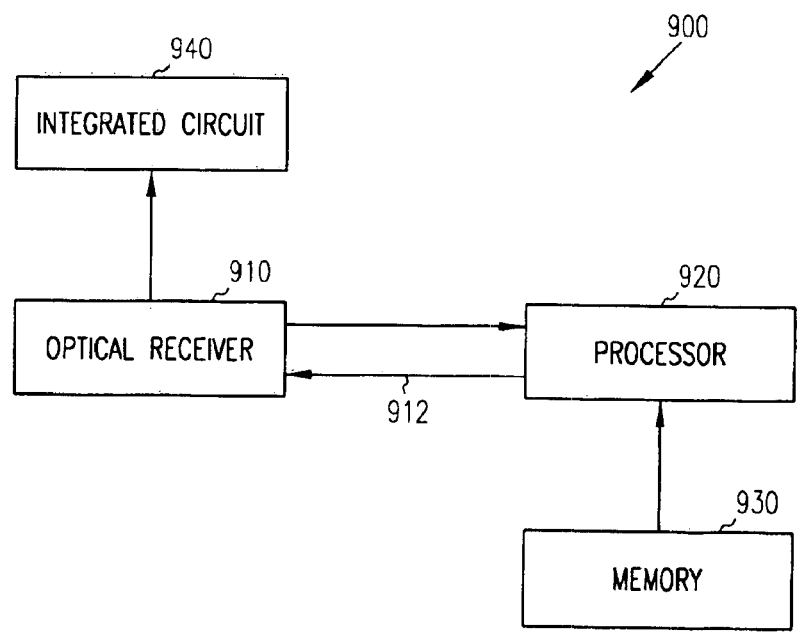
FIG. 9 shows a system diagram in accordance with various embodiments of the present invention.

FIG. 9 shows a system diagram in accordance with various embodiments of the present invention. System 900 includes optical receiver 910, processor 920, memory 930, and integrated circuit 940. Optical receiver 910 can be any of the optical receiver embodiments previously described, or equivalents thereof.

Integrated circuit 940 is a circuit that receives a digital output signal from optical receiver 910. Integrated circuit 940 can be any type of integrated circuit capable of receiving a digital output signal from optical receiver 910. For example, integrated circuit 940 can be a processor such as a microprocessor, a digital signal processor, a microcontroller, or the like. Integrated circuit 940 can also be an integrated circuit other than a processor such as an application-specific integrated circuit (ASIC), a communications device, a modem, a testing device, a network router, a memory controller, or a memory such as a dynamic random access memory (DRAM).

Processor 920 is coupled to optical receiver 910. In some embodiments, processor 920 receives digital signals that represent optical signals received by optical receiver 910. Also in some embodiments, processor 920 provides control information to optical receiver 910. For example, in some embodiments of the present invention, processor 910 provides current control information to optical receiver 910 on node 912. Processor 920 can be any type of processor including, but not limited to, a microprocessor, a microcontroller, a digital signal processor, or the like. Also for example, processor 920 may be a hardware controller or a collection of hardware controllers that perform specific tasks.

Memory 930 represents an article that includes a machine-accessible medium. For example, memory 930 may represent any one or more of the following: a hard disk, a floppy disk, random access memory (RAM), read only memory (ROM), flash memory, CDROM, or any other type of article that includes a medium readable by a machine. Memory 930 may store instructions for performing the execution of the various method embodiments of the present invention. Memory 930 may also include data describing the current state of system 900.

Systems represented by the various foregoing figures can be of any type. Examples of represented systems include computers (e.g., desktops, laptops, handhelds, servers, Web appliances, routers, etc.), wireless communications devices (e.g., cellular phones, cordless phones, pagers, personal digital assistants, etc.), computer-related peripherals (e.g., printers, scanners, monitors, etc.), entertainment devices (e.g., televisions, radios, stereos, tape and compact disc players, video cassette recorders, camcorders, digital cameras, MP3 (Motion Picture Experts Group, Audio Layer 3) players, video games, watches, etc.), and the like.

Figure 10:
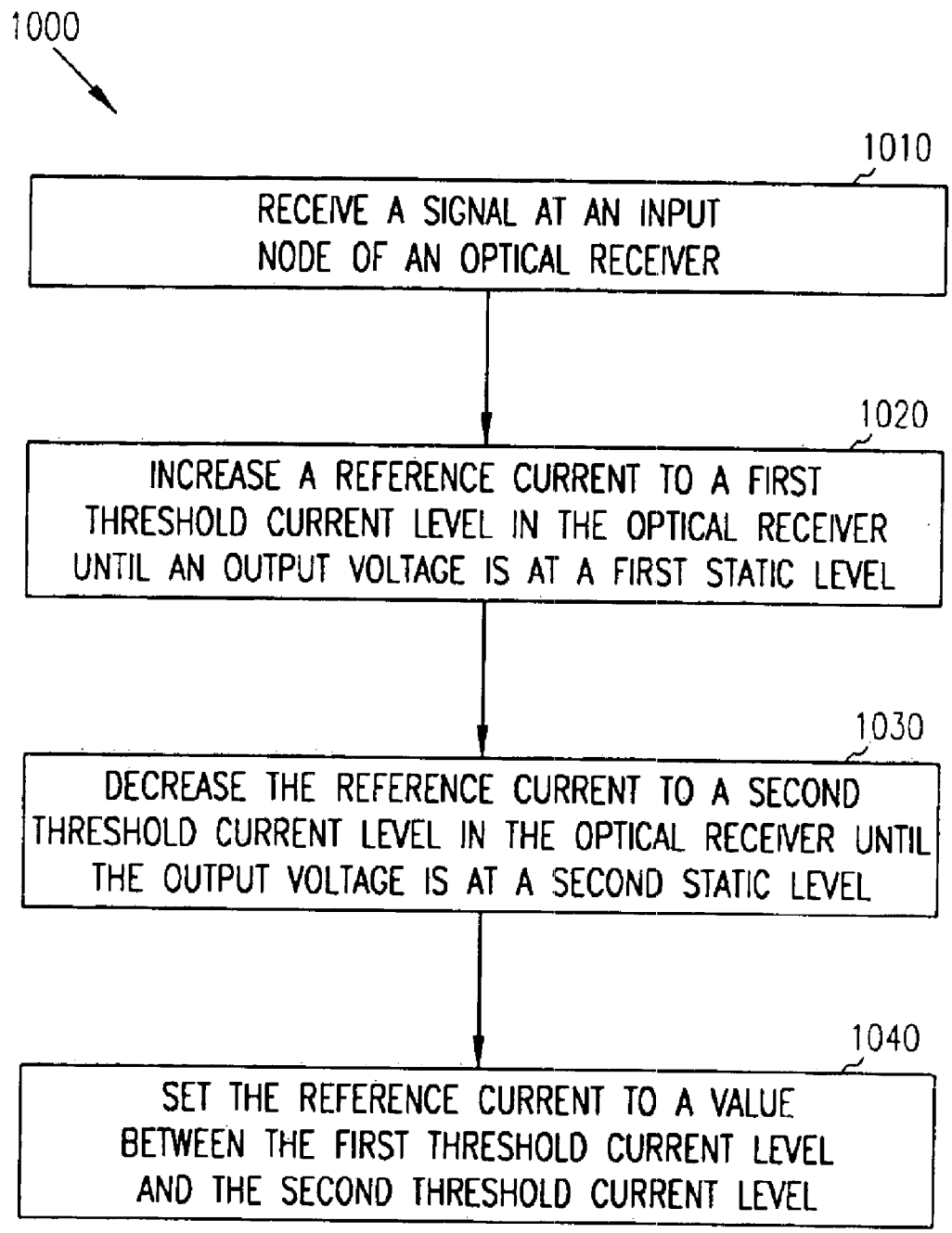
FIG. 10 shows a flowchart in accordance with various embodiments of the present invention.

FIG. 10 shows a flowchart in accordance with various embodiments of the present invention. In some embodiments, method 1000, or portions thereof, is performed by a processor such as processor 920 (FIG. 9). In other embodiments, method 1000 is distributed across multiple processors or controllers. For example, portions of method 1000 may be performed by processor 920 (FIG. 9) while other portions of method 1000 may be performed by controllers 724 and 726 (FIG. 7). The various actions in method 1000 may be performed in the order presented, or may be performed in a different order. Further, in some embodiments, some actions listed in FIG. 10 are omitted from method 1000.

Referring now to FIG. 10, a signal is received at an input node of an optical receiver in block 1010. This corresponds to incident light hitting a photodiode or other suitable light detecting apparatus. In block 1020, a reference current is increased to a first threshold current level in the optical receiver until an output voltage is at a first static level. For example, actions in block 1020 may be performed by increasing a current in a variable current source, such as variable current source 104 (FIGS. 1, 2, 3, 5) until the current reaches first threshold 402 (FIG. 4).

In block 1030, the reference current is decreased to a second threshold current level in the optical receiver until the output voltage is at a second static level. For example, actions in block 1030 may be performed by increasing a current in a variable current source, such as variable current source 104 (FIGS. 1, 2, 3, 5) until the current reaches second threshold 404 (FIG. 4).

In block 1040, the reference current is set to a value between the first and second threshold current levels referred to in blocks 1020 and 1030. The value for the reference current can be determined as an arithmetic average of the first and second threshold current levels, or can be determined as something other than the arithmetic average.

Although the present invention has been described in conjunction with certain embodiments, it is to be understood that modifications and variations may be resorted to without departing from the spirit and scope of the invention as those skilled in the art readily understand. Such modifications and variations are considered to be within the purview and scope of the invention and the appended claims.

What is claimed is:

1. A circuit comprising:
   a photodiode to provide a first current on a first node;
   a variable current source to provide a second current on a second node; and cross-coupled transistors coupled between the first node and the second node to detect a difference between the first current and the second current.

2. The circuit of claim 1 further comprising a switching circuit coupled between the first and second nodes, the switching circuit having a control node, wherein the switching circuit is configured to electrically couple the first and second nodes responsive to the control node.

3. The circuit of claim 1 wherein the cross-coupled transistors are configured to produce a differential voltage in response to the first current and the second current.

4. The circuit of claim 1 wherein the variable current source is configured to source a current in response to a control word from a current control circuit.

5. The circuit of claim 1 wherein the cross-coupled transistors comprise:
   a first n-channel transistor comprising a gate coupled to the first node and a drain coupled to the second node; and
   a second n-channel transistor comprising a gate coupled to the second node and a drain coupled to the first node.

6. The circuit of claim 1 further comprising a current control circuit configured to influence the variable current source.

7. The circuit of claim 6 wherein the photodiode, variable current source, and cross-coupled transistors are part of a first optical receiver, the circuit further comprising:
   a second optical receiver having an output node; and
   a digital comparator coupled to receive an output signal of the first optical receiver and an output signal of the second optical receiver;
   wherein the current control circuit is configured to be responsive to the digital comparator.

8. The circuit of claim 7 wherein the second optical receiver comprises a second photodiode, and the photodiode and second photodiode are in close proximity to each other.

9. The circuit of claim 7 further comprising:
   a variable phase clock source configured to provide a clock signal to the first optical receiver.

10. The circuit of claim 9 further comprising:
    a phase shifting apparatus to receive the clock signal and provide a phase shifted clock signal to the second optical receiver.

11. The circuit of claim 10 wherein the phase shifting apparatus is configured to shift the clock signal by substantially 180 degrees.

12. An integrated circuit comprising:
    first and second photodiodes configured to receive an optical signal;
    a first current mode comparator responsive to the first photodiode;
    a second current mode comparator responsive to the second photodiode;
    a controller to separately control reference currents provided to the first and second current mode comparators; and
    a digital comparator responsive to data output nodes from the first and second current mode comparators.

13. The integrated circuit of claim 12 wherein the first and second photodiodes are in close proximity to each other.

14. The integrated circuit of claim 12 wherein the controller is configured to vary a reference current provided to the second current mode comparator, and to set the reference current provided to the first current mode comparator in response to an output signal from the digital comparator.

15. The integrated circuit of claim 14 further comprising a variable phase clock source configured to source a clock signal to the first current mode comparator in response to the digital comparator.

16. The integrated circuit of claim 15 further comprising a phase shifter to source a phase shifted clock signal to the second current mode comparator.

17. A system comprising:
   a photodiode to provide a first current on a first node;
   a variable current source to provide a second current on a second node;
   cross-coupled transistors coupled between the first node and the second node to detect a difference between the first current and the second current to provide an output signal; and
   a microprocessor responsive to the output signal.

18. The system of claim 17 further comprising a switching circuit coupled between the first and second nodes, the switching circuit having a control node, wherein the switching circuit is configured to electrically couple the first and second nodes responsive to the control node.

19. The system of claim 17 wherein the cross-coupled transistors are configured to produce a differential voltage in response to the first current and the second current.

20. The system of claim 17 wherein the variable current source is configured to source a current in response to a control word from a current control circuit.

21. The system of claim 17 further comprising a current control circuit configured to influence the variable current source.

22. The system of claim 17 wherein the cross-coupled transistors comprise:
   a first n-channel transistor comprising a gate coupled to the first node and a drain coupled to the second node; and
   a second n-channel transistor comprising a gate coupled to the second node and a drain coupled to the first node.

23. A method comprising:
   receiving a signal at an input node of an optical receiver;
   increasing a reference current to a first threshold current level in the optical receiver until an output voltage is at a first static level;
   decreasing the reference current to a second threshold current level in the optical receiver until the output voltage is at a second static level; and
   setting the reference current to a value between the first threshold current level and the second threshold current level.

24. The method of claim 23 wherein the signal includes a data pattern that comprises a plurality of logic levels.

25. The method of claim 24 wherein the data pattern is a data pattern received during data communications.

26. The method of claim 24 wherein the data pattern comprises alternating binary logic levels.

27. The method of claim 23 wherein setting the reference current comprises setting the reference current to an average of the first threshold current level and the second threshold current level.

28. An article comprising a machine-accessible media having associated data, wherein the data, when accessed, results in a machine performing:
   increasing a reference current to a first threshold current level in an optical receiver until an output voltage is at a first static level;
   decreasing the reference current to a second threshold current level in the optical receiver until the output voltage is at a second static level; and
   setting the reference current to a value between the first threshold current level and the second threshold current level.

29. The article of claim 28 wherein setting the reference current comprises setting the reference current to an average of the first threshold current level and the second threshold current level.

30. The article of claim 28 wherein setting the reference current comprises setting the reference current to a value other than an average of the first threshold current level and the second threshold current level.

* * * * *